United States Patent
Kumar et al.

(10) Patent No.: US 6,642,127 B2
(45) Date of Patent: Nov. 4, 2003

(54) METHOD FOR DICING A SEMICONDUCTOR WAFER

(75) Inventors: Ajay Kumar, Sunnyvale, CA (US);
Padmapani C. Nallan, San Jose, CA (US); Anisul Khan, Sunnyvale, CA (US); Dragan V. Podlesnik, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/035,372

(22) Filed: Oct. 19, 2001

(65) Prior Publication Data
US 2003/0077878 A1 Apr. 24, 2003

(51) Int. Cl.$^7$ ............................................. H01L 21/301
(52) U.S. Cl. ........................ 438/460; 438/462; 438/463; 438/464
(58) Field of Search ............................... 438/460, 462, 438/463

(56) References Cited

U.S. PATENT DOCUMENTS

| | | | | |
|---|---|---|---|---|
| 3,615,956 A | * | 10/1971 | Irving et al. | 134/1.2 |
| 4,325,182 A | * | 4/1982 | Tefft et al. | 148/DIG. 84 |
| 4,904,617 A | * | 2/1990 | Muschke | 148/DIG. 131 |
| 5,284,792 A | * | 2/1994 | Forster et al. | 148/DIG. 28 |
| 5,422,286 A | * | 6/1995 | Yang | 257/E29.327 |
| 5,753,537 A | * | 5/1998 | Dekker et al. | 438/113 |
| 5,824,595 A | * | 10/1998 | Igel et al. | 438/464 |
| 5,904,548 A | * | 5/1999 | Orcutt | 438/460 |
| 5,972,781 A | * | 10/1999 | Wegleiter et al. | 438/460 |
| 6,117,347 A | * | 9/2000 | Ishida | 216/52 |
| 6,214,703 B1 | * | 4/2001 | Chen et al. | 438/462 |
| 6,406,979 B2 | * | 6/2002 | Fischer et al. | 438/460 |

* cited by examiner

Primary Examiner—John F. Niebling
Assistant Examiner—Angel Roman
(74) Attorney, Agent, or Firm—Moser Patterson & Sheridan; Joseph Bach

(57) ABSTRACT

A method and apparatus for dicing a semiconductor wafer using a plasma etch process. The method begins by applying a patterned mask to the integrated circuits on a wafer. The pattern covers the circuits and exposes the streets between the dice. Next, the method deposits a uniform layer of adhesive material upon a carrier wafer. The wafer to be diced is affixed to the carrier wafer via the adhesive material that is sandwiched between the bottom surface of the wafer to be diced and the top surface of the carrier wafer. The combination assembly of the carrier wafer, adhesive and wafer to be diced is placed in an etch reactor that is capable of etching silicon. When the reactive gas is applied to the combination assembly, the etch plasma will consume the unprotected silicon within the streets and dice the wafer into individual integrated circuit chips. The carrier wafer is then removed from the etch chamber with the dice still attached to the adhesive layer. A well-known process is used to remove the adhesive material as well as any mask material and detach the dice from the carrier wafer.

22 Claims, 2 Drawing Sheets

METHOD FOR DICING A SEMICONDUCTOR WAFER

BACKGROUND OF THE INVENTION

1. Field of the Invention

The invention relates to semiconductor wafer processing and, more particularly, to a method and apparatus for dicing a semiconductor wafer into a plurality of individual dice.

2. Description of the Related Art

In semiconductor wafer processing, integrated circuits are formed on a wafer (also referred to as a substrate) comprising silicon or another semiconducting material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual dice from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets". The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils. or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a rectangular die can be scribed in the <110>direction of the crystalline structure. Consequently, cleaving of the other side of the die results in a jagged separation line. Because of chipping and cracking, additional spacing is required between the dice on the wafer to prevent damage to the integrated circuits, i.e., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns must separate the circuitry of each of the dice. Furthermore, after cutting, the dice require substantial cleaning to remove particles and other contaminants that result from the sawing process.

In an effort to overcome the disadvantages of sawing and scribing. A wet etch process has been proposed to be used in dicing a wafer. The wet etch technique requires an etch mask to be formed on at least one side of the wafer and, in some embodiments, both sides of the wafer. The etch mask defines where the silicon will be etched and protects the integrated circuits from the etchant. Once the mask is in place, the wafer to be immersed in a wet etchant such as potassium hydroxide. The wet etchant removes silicon from between the dice such that the dice are separated from one another.

A wet etch technique removes silicon at a rate of about 30 microns per hour. Thus, even a wafer that has been thinned to a thickness of about 200 microns will require about 7 hours to complete the dicing process. Furthermore, there are well-known disadvantages to wet etch techniques such as the trenches formed with a wet etch do not have substantially vertical sidewalls, the trenches are relatively wide and, to achieve deep vertically directed trenches, the semiconductor wafer can only have certain specific crystal orientations. Further information about such a technique is disclosed in U.S. Pat. No. 5,940,546.

Therefore, there is a need in the art for a method and apparatus for dicing a semiconductor wafer using a smaller separation between the dice and a fast dicing process.

SUMMARY OF THE INVENTION

The present invention is a method and apparatus for dicing a semiconductor wafer using a plasma etch process. The method of the present invention begins by applying a patterned mask to the integrated circuits on a wafer. The pattern covers the circuits and exposes the streets between the dice. Next, the method deposits a uniform layer of adhesive material upon a carrier wafer. The wafer to be diced is affixed to the carrier wafer via the adhesive material that is sandwiched between the bottom of the wafer to be diced and the top surface of the carrier wafer. The combination assembly of the carrier wafer, adhesive and wafer to be diced is placed in an etch reactor that is capable of etching silicon. When the reactive gas is applied to the combination assembly, the etchant plasma will consume the unprotected silicon within the streets and dice the wafer into individual integrated circuit chips. The carrier wafer is then removed from the etch chamber with the dice still attached to the adhesive layer. A well-known process is used to remove the adhesive material as well as any remaining mask material and detach the dice from the carrier wafer.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
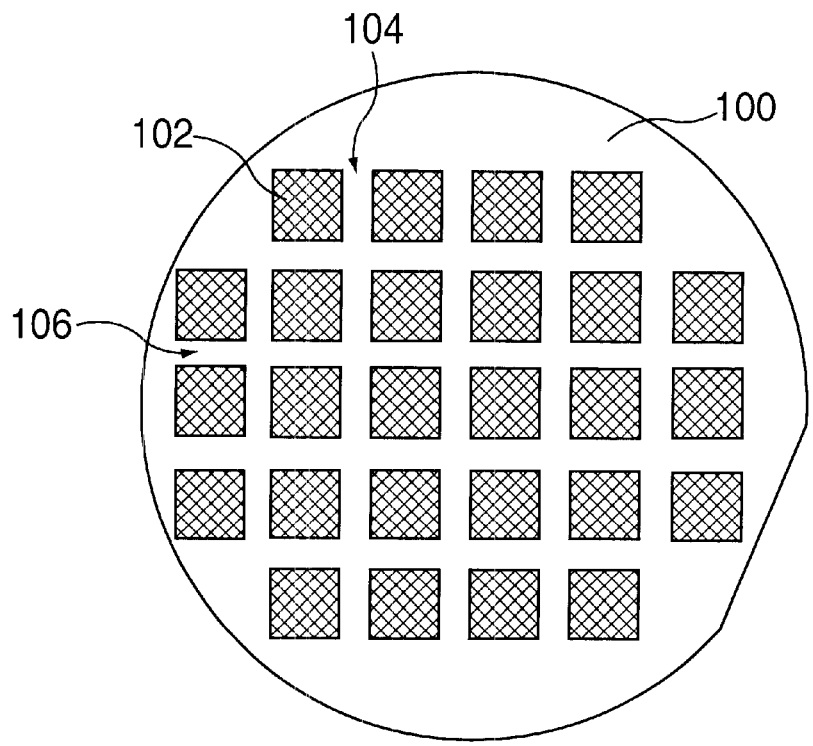
FIG. 1 is a top plan view of a semiconductor wafer to be diced.

FIG. 1 depicts a semiconductor wafer having a plurality of regions 102 that contain integrated circuits. The regions 102 are separated by vertical streets 104 and horizontal streets 106. The streets 104 and 106 are areas of semiconductor wafer that do not contain integrated circuits and are designed as locations along which the wafer will be diced. The present invention uses a plasma etch technique to cut trenches through the semiconductor wafer along the streets such that the dice are separated into individual chips. Since a plasma etch process is crystal structure orientation independent, the crystal structure of the semiconductor wafer to be diced is immaterial to achieving a vertical trench through the wafer.

Figure 2:
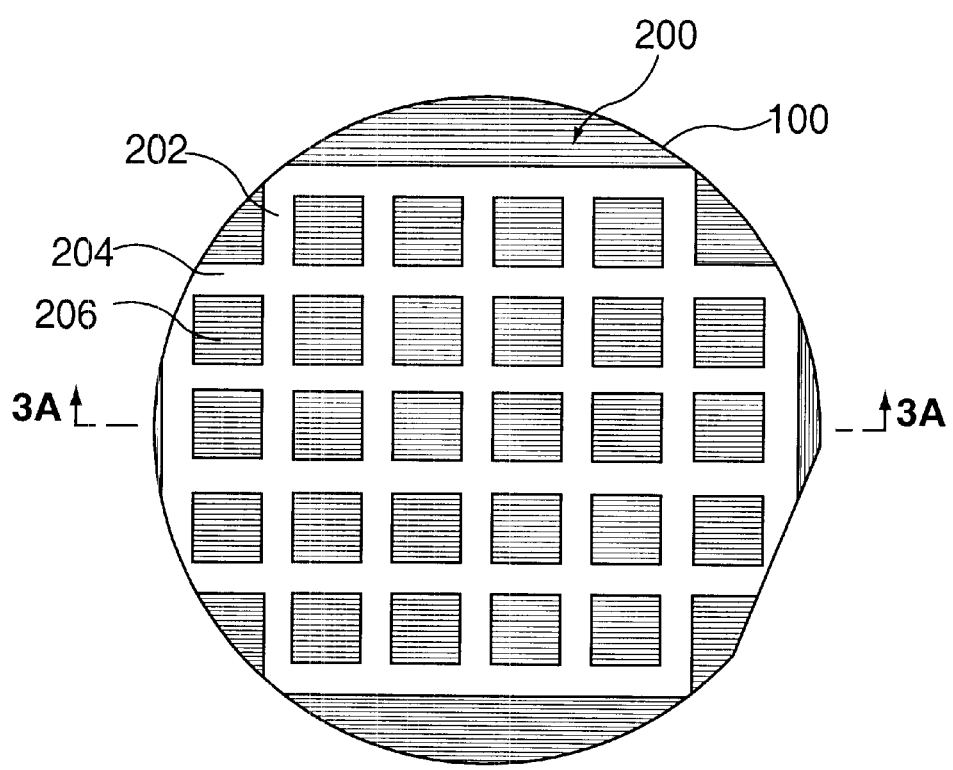
FIG. 2 is a top plan view of a semiconductor wafer to be diced that has a dicing mask applied thereto.

FIG. 2 is a top plan view of the semiconductor wafer 100 having a photoresist mask 200 deposited upon the wafer 100. The mask is deposited in a conventional manner to achieve a 4–5 micron thick layer. The photoresist mask 200 defines the locations (gaps 202 and 204) along the streets 104 and 106 where the wafer 100 will be diced. The gaps are about 20 microns wide. The integrated circuit regions of the semiconductor wafer 100 are covered and protected by the photoresist mask 200. The regions 206 of the mask 200 are positioned such that during the etching process the integrated circuits are not degraded by the etch process. Horizontal gaps 202 and vertical gaps 204 are formed between the regions 206 to define the areas that will be etched during the etching process to dice the wafer. Although a photoresist mask is described as one embodiment of a technique for protecting the integrated circuits, other mask materials may be used in a similar manner.

Figure 3A:
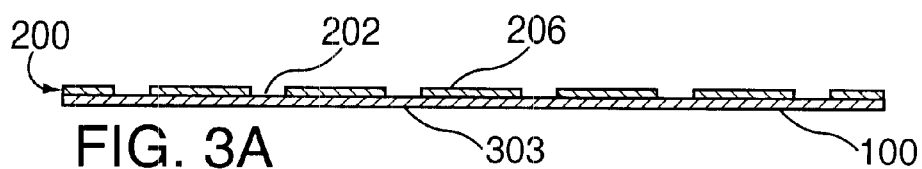
FIGS. 3A–3E depicts the process steps for dicing a semiconductor wafer in accordance with an embodiment of the present invention.

FIG. 3A depicts a cross section of the wafer 100 and applied mask 200 taken along line 3A—3A of FIG. 2. FIGS. 3A–3E illustrate the major process steps used to dice the semiconductor wafer in accordance with the present invention. The wafer 100 has mask regions 206 protecting the integrated circuit portions on the wafer and the streets are open to being etched by gaps 202. As mentioned above, the photoresist material that is used as the mask is deposited to a thickness of 4–5 microns and the gaps are approximately 20 microns wide. The thickness and gap width will vary depending upon the type of etchant plasma and type of etch chamber that is used to perform the etch process.

Figure 3B:
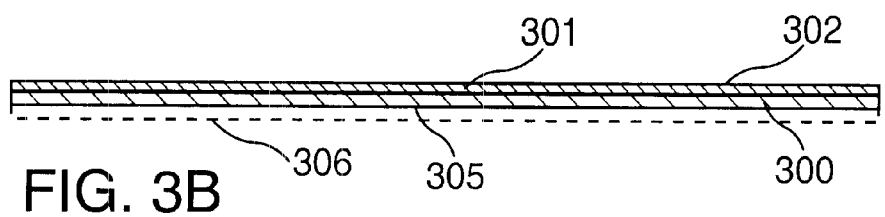
Figure 3C:
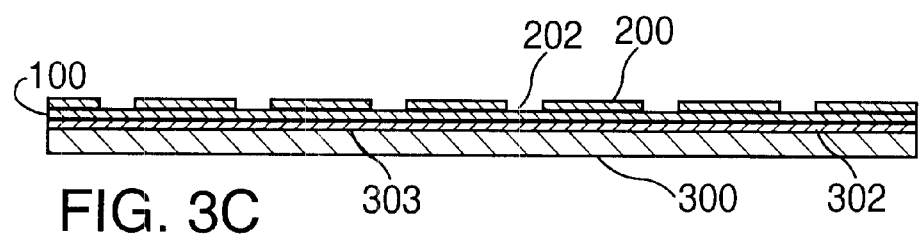

FIG. 3B depicts a carrier wafer 300 having a first surface 301 upon which a uniform layer 302 of adhesive material is deposited in a conventional manner. The adhesive material is deposited to a thickness of about 4–5 microns. The adhesive material may be photoresist material, thermal paste, or some other material that will temporarily adhere a semiconductor wafer 100 to the carrier wafer 300. The carrier wafer 300 may be fabricated of glass, silicon, pyrex, metal or other materials that are compatible with silicon etching processes. The carrier wafer 300 has a form factor that is similar to a wafer 100 to be diced such that the conventional wafer handling robotics can move the carrier wafer 300 in the same manner as a semiconductor wafer 100. As such, this embodiment does not require modification of the wafer handling equipment that supports a plasma etch chamber. FIG. 3C depicts the carrier wafer 300 and adhesive layer 302 of FIG. 3B being affixed to the bottom surface 303 of the wafer 100 that is to be diced. This combination of carrier wafer 300 and wafer 100 is then transported to an etch chamber.

In one embodiment of the invention, the etching process is accomplished using a decoupled plasma source (DPS) plasma etch chamber manufactured by Applied Materials, Inc. of Santa Clara, Calif. However, any plasma etch chamber capable of etching silicon may be used. The reactive gas used to etch silicon is generally a fluorine-based gas such as $SF_6$, $C_4F_8$, $CHF_3$, $XeF_2$, or any other reactant gas capable of etching silicon at a relatively fast etch rate. Using the DPS chamber and $SF_6$ as the etchant gas, the etch rate achieved for etching a silicon wafer is 10 microns per minute. A plasma etch performed within the DPS chamber provides vertical trench walls that form the edges of the chips. The photoresist that couples the chips to the carrier wafer remains intact during etching such that the carrier wafer and the separated chips may be removed from the plasma chamber using a conventional robot.

Figure 3D:
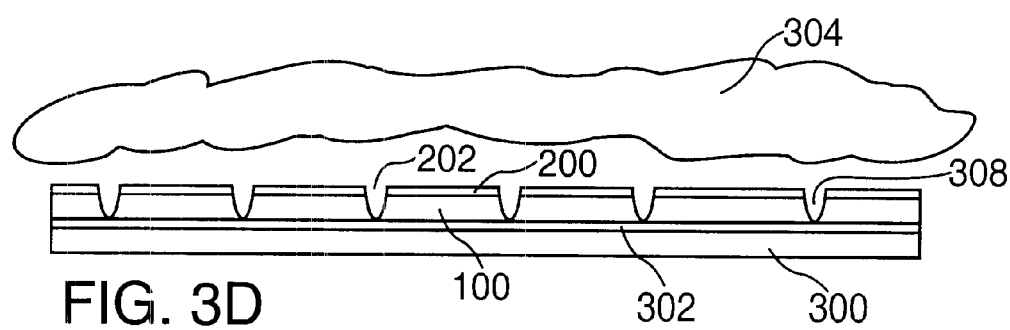

FIG. 3D depicts an etchant plasma 304 formed above the semiconductor wafer 100 and mask 200. The plasma 304 etches the silicon within the gaps 204 in the mask until the etched material is removed to form trenches 308 that extend down to the photoresist layer 302. The trenches are about 20 microns wide and, in this embodiment, extend completely through the wafer, i.e., in a thinned wafer, the depth can be about 200 microns. The etching process is stopped when the photoresist layer 302 is encountered by the plasma 304.

As mentioned above, the carrier wafer 300 may be fabricated of silicon, glass (e.g., quartz or pyrex), metal, or some other material that is compatible with silicon etch processes. If the carrier wafer 300 is fabricated of silicon, the carrier wafer 300 becomes a consumable component of the technique such that when the etchant plasma cuts through the semiconductor wafer 100 it will also etch into the silicon carrier wafer 300 thus destroying that carrier wafer. If the adhesive is used as an etch stop, then the silicon carrier wafer may be spared from etching and be reused. When using a glass or metal carrier wafer 300 the etchant will not etch the carrier wafer and as such the plasma etching process will stop upon reaching the carrier wafer 300. As such, a carrier wafer made of a non-consumable material is reusable.

In some plasma etch chambers, the wafer is retained by an electrostatic chuck. To facilitate electrostatically chucking the carrier wafer 300, the carrier wafer's glass is generally coated on a second surface 305 with indium tin oxide (ITO). ITO facilitates electrostatic retention of the carrier wafer upon the electrostatic chuck, yet provides a material that facilitates releasing the wafer from the chuck. A layer 306 (shown in phantom) illustrates that the ITO layer is optionally located on the bottom surface 305 of the carrier wafer 300. If the carrier wafer is silicon or some other semiconducting material, the ITO layer is not necessary.

When etching silicon, the etch rate is dependent upon temperature. As such, it is important that the wafer 100 dissipate heat efficiently into the carrier wafer 300. The adhesive layer 302 should provide very good thermal transfer from the silicon wafer 100 to the carrier wafer 300. During silicon etching, the electrostatic chuck and its associated heat exchanger maintains the wafer being diced at 5 to 10° C. and this temperature should be uniform across the entire wafer to ensure that the wafer is properly etched. As such, good thermal transfer between the wafer 100 being etched and the carrier wafer 300 to the electrostatic chuck is important. A layer of photoresist material provides this important function. Other adhesives may also be used to provide an adhesive function and a thermal transfer function. The foregoing temperature range is exemplary of a range used in silicon etch processes; however, those skilled in the art will realize that other, higher or lower, temperatures may be used depending upon the process chemistry and recipe used in the silicon etch process.

Figure 3E:
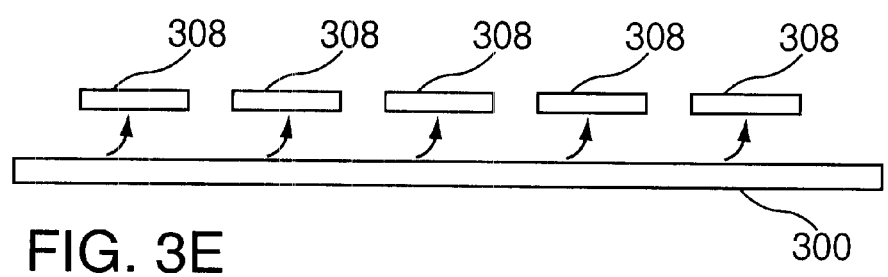

As shown in FIG. 3E, once etched, the carrier wafer 300 and wafer 100 are removed from the chamber and the chips 308 are removed from the carrier wafer 300 using a conventional adhesive dissolving technique such as the application of acetone or other solvents to remove the photoresist material. The chips 308 can then be lifted from the carrier wafer 302. The carrier wafer may then be re-used to support another semiconductor wafer that is to be diced.

In another embodiment of the invention, the semiconductor wafer may be etched to a predefined depth without extending the trenches completely through the wafer.

Subsequently, a force applied to the wafer by a roller or other device may be used to "break" the wafer along the etched streets and separate the dice. Since, in this embodiment, the etch process does not extend completely through the wafer, a carrier wafer may not be necessary. However, if the wafer has been "thinned", a carrier wafer may still be necessary even if the trenches do not extend completely through the wafer. For a thinned wafer, the carrier wafer provides structural support for the wafer to facilitate robot handling, wafer retention in the reactor, thermal control during processing, and so on.

While the foregoing is directed to the preferred embodiment of the present invention, other and further embodiments of the invention may be devised without departing from the basic scope thereof, and the scope thereof is determined by the claims that follow.

What is claimed is:

1. A method for dicing a semiconductor wafer comprising a plurality of integrated circuits, comprising:

forming a patterned mask upon a semiconductor wafer, the mask comprising a layer covering and protecting the integrated circuits and defining gaps between the integrated circuits;

affixing the semiconductor wafer to a carrier wafer by applying an adhesive between a bottom of the semiconductor wafer and the carrier wafer, wherein the adhesive is selected to act as an etch stop; and plasma etching the wafer through the gaps in said mask to form a trench around each of the integrated circuits.

2. The method of claim 1 wherein said trench extends through the semiconductor wafer and separates the individual integrated circuits from one another.

3. The method of claim 1 wherein said trench extends partially through the semiconductor wafer and the method further comprises:

applying a force to the semiconductor wafer to separate the individual integrated circuits from one another.

4. The method of claim 1, wherein plasma etching the wafer comprises exposing the wafer to a plasma comprising a fluorine-containing gas.

5. The method of claim 1 wherein said carrier wafer is glass, silicon or metal.

6. The method of claim 1 wherein said plasma etching is independent of crystal orientation of the semiconductor wafer.

7. The method of claim 1 wherein the gaps are aligned with streets between integrated circuits.

8. The method of claim 1 wherein said trench is about 20 microns wide.

9. The method of claim 1, wherein the adhesive provides thermal transfer from the semiconductor wafer to the carrier wafer.

10. The method of claim 1, wherein the adhesive comprises a layer of photoresist material.

11. A method for dicing a semiconductor wafer comprising a plurality of integrated circuits, comprising:

forming a patterned mask upon a semiconductor wafer, the mask comprising a layer covering and protecting the integrated circuits and defining gaps between the integrated circuits;

applying an adhesive between a carrier wafer and a bottom of the semiconductor wafer, the carrier wafer being made of glass or metal; and plasma etching the wafer through the gaps in said mask to form a trench around each of the integrated circuits.

12. The method of claim 11 wherein said adhesive comprises a layer of photoresist material.

13. The method of claim 11, wherein the adhesive provides thermal transfer from the semiconductor wafer to the carrier wafer.

14. The method of claim 11, wherein the adhesive is selected to act as an etch stop.

15. A method for dicing a semiconductor wafer comprising a plurality of integrated circuits, comprising:

forming a patterned mask upon a semiconductor wafer, the mask comprising a layer covering and protecting the integrated circuits and defining gaps between the integrated circuits;

affixing said semiconductor wafer to a carrier wafer, wherein a bottom portion of the carrier wafer is coated with indium tin oxide; and plasma etching the wafer through the gaps in said mask to form a trench around each of the integrated circuits.

16. A method for dicing a semiconductor wafer comprising a plurality of integrated circuits, comprising:

forming a patterned mask upon a semiconductor wafer, the mask comprising a layer covering and protecting the integrated circuits and defining gaps between the integrated circuits;

affixing the semiconductor wafer to a carrier wafer made of metal; and plasma etching the wafer through the gaps in said mask to form a trench around each of the integrated circuits.

17. The method of claim 16, wherein the trench extends through the semiconductor wafer and separates the individual integrated circuits from one another.

18. The method of claim 16, wherein the trench extends partially through the semiconductor wafer; and the method further comprises applying a force to the semiconductor wafer to separate the individual integrated circuits from one another.

19. The method of claim 16, wherein plasma etching the wafer comprises exposing the wafer to a plasma comprising a fluorine-containing gas.

20. The method of claim 16, wherein the trench is about 20 microns wide.

21. A method for dicing a semiconductor wafer comprising a plurality of integrated circuits, comprising:

forming a patterned mask upon a semiconductor wafer, the mask comprising a layer covering and protecting the integrated circuits and defining gaps between the integrated circuits;

affixing the semiconductor wafer to a carrier wafer by applying an adhesive between a bottom of the semiconductor wafer and the carrier wafer, wherein the adhesive is selected to act as an etch stop, wherein indium tin oxide is deposited on a bottom portion of the carrier wafer; and plasma etching the wafer through the gaps in said mask to form a trench around each of the integrated circuits.

22. A method for dicing a semiconductor wafer comprising a plurality of integrated circuits, comprising:

forming a patterned mask upon a semiconductor wafer, the mask comprising a layer covering and protecting the integrated circuits, and defining gaps between the integrated circuits;

affixing the semiconductor wafer to a carrier wafer made of glass or metal, wherein indium tin oxide is deposited on a bottom portion of the carrier wafer; and plasma etching the wafer through the gaps in said mask to form a trench around each of the integrated circuits.

* * * * *